United States Patent [19]
Laurent et al.

[11] Patent Number: 6,026,131
[45] Date of Patent: Feb. 15, 2000

[54] AUTOMATIC GAIN CONTROL SYSTEMS

[76] Inventors: Souef Laurent, 2 Chemin du Logis, 06560 Opio; John Whittle, 2/2 Impasse des Genevriers, Route de Biot, 06560 Valbonne, both of France

[21] Appl. No.: 08/579,171

[22] Filed: Dec. 27, 1995

[51] Int. Cl.[7] ................................................. H04L 27/06
[52] U.S. Cl. ............................................................. 375/345
[58] Field of Search .......................... 364/715; 375/345; 455/89, 226, 38.3, 234.1, 522, 240.1, 232.1

[56] References Cited

U.S. PATENT DOCUMENTS

| | | | |
|---|---|---|---|
| 4,455,663 | 6/1984 | Ragsdale | 375/345 |
| 4,619,002 | 10/1986 | Thro | 455/226 |
| 4,747,065 | 5/1988 | West | 364/715 |
| 4,835,790 | 5/1989 | Yoshida et al. | 375/345 |
| 5,142,695 | 8/1992 | Roberts et al. | 455/89 |
| 5,187,809 | 2/1993 | Rich et al. | 375/345 |
| 5,305,351 | 4/1994 | Mizoguchi | 375/345 |
| 5,446,761 | 8/1995 | Nag et al. | 375/345 |
| 5,452,332 | 9/1995 | Otani et al. | 375/345 |
| 5,493,712 | 2/1996 | Ramesh et al. | 375/345 |

*Primary Examiner*—Don N. Vo
*Attorney, Agent, or Firm*—Burns,Doane, Swecker & Mathis, L.L.P.

[57] ABSTRACT

An automatic gain control for a digital mobile telephone receiver includes digital-to-analog converters for the I and Q components of an input Gaussian minimum shift-keying signal. The system computes values corresponding to the greater of the two samples of a pair less a fraction of the lesser of the two samples. An average of this value is computed for a multiplicity of symbols and the average is compared with a threshold. If the average is less than the threshold, a gain control value is incremented. If the average exceeds the threshold, alteration in the gain value is inhibited.

13 Claims, 3 Drawing Sheets

AUTOMATIC GAIN CONTROL SYSTEMS

FIELD OF THE INVENTION

The present invention relates to the provision of automatic gain control in demodulators for the reception and decoding of received radio frequency signals conveying modulation imposed in accordance with an original digital data stream prior to the transmission of the radio frequency signals. The invention particularly relates to gain control for mobile receivers such as cellular telephones.

BACKGROUND TO THE INVENTION

Cellular telephones and other mobile radio so that the decoded process is subject to the minimum of errors or ambiguities.

A variety of automatic gain control systems are in use at the present time, and vary from the simple to the quite sophisticated, the latter employing analog-to-digital conversion of the input signal and the use of a programmed microprocessor to derive an automatic gain control signal.

The present invention is based on a design concept which enables variation in such measures as the acquisition time, the comparison thresholds and initial gain setting, yet can be implemented using minimal hardware or computational routines.

BRIEF SUMMARY OF THE INVENTION

The preferred embodiments of the present invention employ a digital control loop. It is intended for use in shift-keying systems wherein the receiver or demodulator provide, as explained below, in-phase (I) and quadrature (Q) signals. The automatic gain control computes, employing a succession of samples of the I and Q signals, a digital gain value. Preferably the computation is performed by a determination of which of the pair of I and Q samples is the greater and subtracting a fractional value of the lesser from the greater, and computing a mean of that derived value over a succession of samples. The received signal strength value as thus computed may be compared with a threshold, which is preferably programmable. In one mode of operation, the relationship between the received signal strength value and the threshold can be used to alter the gain control signal, preferably incrementally.

A fuller explanation of the invention is given hereinafter with reference to a preferred embodiment described by way of example only.

DETAILED DESCRIPTION OF EXEMPLARY EMBODIMENT

Figure 1:
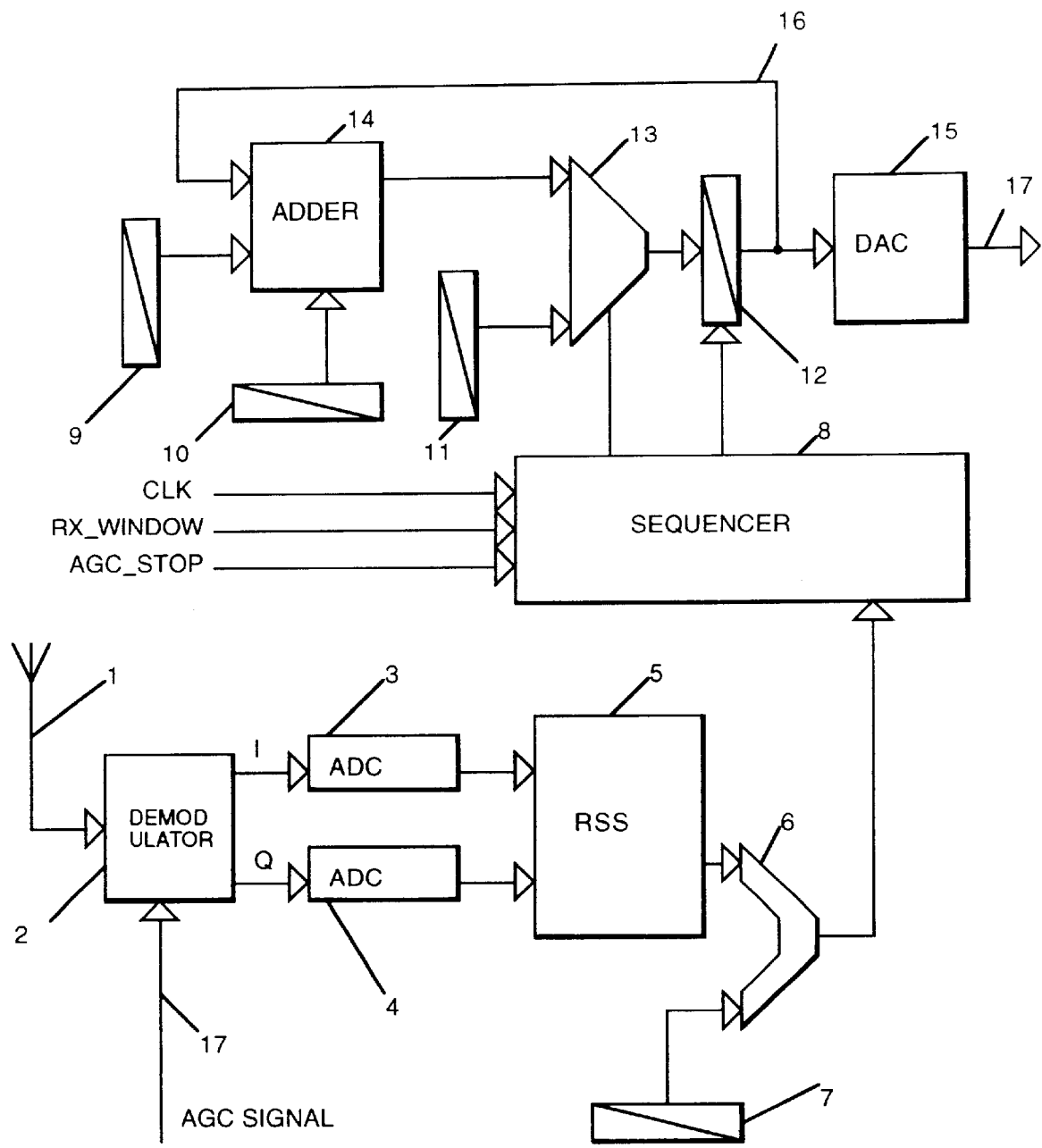
FIG. 1 is a schematic block diagram of one embodiment of a receiver including an automatic gain control system according to the present invention.

The preferred embodiment shown in FIG. 1 is intended to form part of a cellular telephone which incorporates a receiver for radio frequency signals modulated in accordance with minimum shift-keying (MSK), wherein, as is well known, binary values are associated with respective frequencies and the phase of the modulated signal is controlled so as to avoid any phase discontinuities in the modulated signal. In particular, the frequency spacing between the shift frequencies is preferably chosen so that the two frequency shift-key signal waveforms are orthogonal with a minimum frequency spacing. As is known practice, the transmitted signal may be passed through a Gaussian filter; this particular form of modulation is known as Gaussian minimum shift-keying.

The receiver incorporating the preferred embodiment of the present invention includes an antenna 1 and a demodulator 2. Since the specific construction of the demodulator is of no consequence to the present invention, the demodulator will not be described in detail. It normally includes at least one amplifier of which the gain needs to be controlled and two receiver channels, for the in-phase and quadrature components of the MSK waveform, together with a local oscillator, mixers and filters by means of which the I and Q signals can be demodulated to recover the original digital data stream.

It should be understood that the presence of in-phase and quadrature channels is not particular to minimum shift-keying. In the particular case of minimum shift-keying, the MSK waveform is normally in the form:

$$\phi msk(t) = A\{i(t)\cos \pi t/2T \cdot \cos f/2\pi \cdot t - q(t)\sin \pi t/2T \cdot \sin f/2\pi \cdot t\}$$

wherein i and q are the amplitudes of the in-phase and quadrature components, f is the carrier frequency and 2T is the period corresponding to the symbol rate.

However, in-phase and quadrature components occur in other forms of shift-keying, for example quadrature amplitude modulation. In this method of shift-keying the I and Q data signals are modulated using double side-band, suppressed carrier modulation, the in-phase signal I using the in-phase carrier reference and the Q signal using the quadrature carrier reference, the modulated I and Q signals being added to form the resultant quadrature amplitude modulated (QAM) signal. It will be understood that QAM can be viewed as phase modulation if the I and Q signals have identical magnitudes, and is then normally called quadrature phase shift-keying (QPSK) which may include, for example, one bit delay in the quadrature data stream for modulation.

Other techniques in which I and Q components occur in the signal include amplitude phase shift-keying employing partial response signalling in both the in-phase and quadrature signal paths.

Thus, the automatic gain control technique employed in the present invention may be generally applied to any receiver which employs at least two signal channels so that I and Q components of the received signal are present at some point in the demodulator 2. As will be seen.

Each of the I and Q signals in the demodulator is converted by means of a respective one of two analog-to-digital converters 3 and 4 into a succession of samples at an appropriate rate determined by a clock signal. Obviously, the sampling frequency must be sufficient to avoid aliasing or inter-symbol interference.

For each sampling time there will be a pair of samples, one sample of the in-phase signal and one sample of the quadrature signal. The pairs of samples are received by a received signal strength (RSS) calculator 5. A particular embodiment of the calculator 5 is more particularly described with reference to FIG. 4.

In a baseband mode of operation of the AGC circuit, for each pair of samples I and Q, the calculator 5 is arranged to determine which of the samples in the pair is the larger (Smx) and which is the lesser (Smn) and to determine the quantity:

$$Smx - K \cdot Smn$$

where K is a coefficient and is typically in the region of 0.4.

Preferably the coefficient K is a combination of binary fractions, i.e. 2exp(−m) where m is an integer, because such fractions can be obtained by a simple shifting of the binary point and adding circuit.

For example, if the coefficient K is chosen to be 0.375, the magnitude of the second component may be obtained by three binary point shifts and one addition, the second and third shifts yielding a quarter and one eighth of the quantity Smn and the summation of the latter two quantities giving 0.375 Smn. Other compound binary fractions could be obtained in a similar manner.

The value of the received signal strength is obtained for a programmable or selectable succession of pairs of I and Q values so as to obtain an average value that may be compared by a comparator 6 with a threshold, set by a threshold circuit 7.

As will be further explained later, the computation of the received signal strength would be different for operation of the AGC at an intermediate frequency.

A sequencer 8 is controlled by three signals, denoted CLK, RX_WINDOW and AGC_STOP. The CLK signal is a clock signal employed also to control the analog-to-digital conversion the digital-to-analog conversion to be described and generally in the circuit. The RX_WINDOW signal is generated from a window generator (not shown) which is preferably controlled by a counter of which the count cycle is synchronized to the time base of a local base station serving the communications cell in which the mobile receiver (telephone) is currently located. The RX_WINDOW signal denotes a time division or succession of time divisions in which the telephone is permitted to receive and process signal packets in the correct time division according to the time division multiple access protocol governing the operation of the telephone and the co-operative cellular network.

The general operation of the circuit is to determine whether the received signal strength exceeds a threshold, set in the threshold register 7, and either to halt if the received signal strength is greater than the threshold, which in this example corresponds to a maximum desired gain, or to increment a gain value which is held in a 'result' register 12 and is converted into analog form by means of a digital analog converter 15 and is applied on a line 17 as an automatic gain control signal to amplifiers (not shown) within the demodulator 2.

The initial gain control value, which may represent zero gain, is set into a register 11, hereinafter called the MIN register. The value in the MIN register 11 or the output of an adder 14 are input to a multiplexer 13, which is controlled by the sequencer 8 to pass initially the gain value set in register 11 to the result register 12. Subsequently the multiplexer passes the output of an adder 14 to the result register. The content of the result register is coupled by way of a loop 16 to one input of the adder 14, which is augmented by a selectable incremental value set in a STEP register 9. The routine repeats, incrementing the contents of the result register 12 in each repetition and thereby incrementally changing the AGC control signal until the computed value of the received signal strength exceeds the threshold value in register 7.

A control register 10 determines whether the adder produces an increasing or decreasing output, i.e. whether the slope of the output is positive or negative. This enables the output of the DAC 15 to control AGC amplifiers of which the relationship between a control signal and the gain is either inverting or non-inverting.

The gain is then held constant until the RX_WINDOW signal goes low. At this point the gain is reset to the minimum value.

Figure 2:
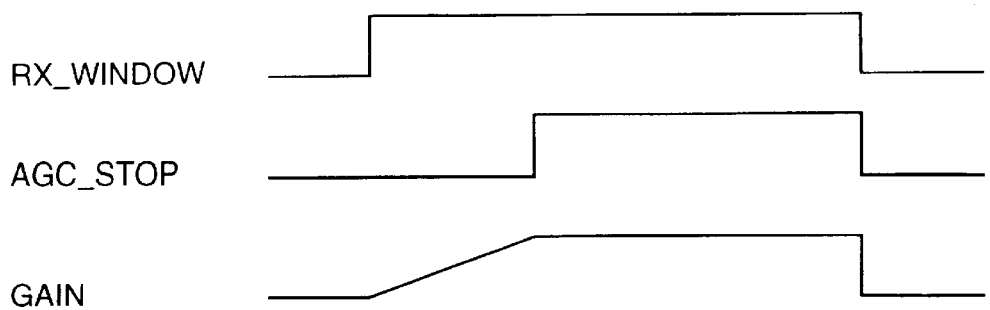
FIG. 2 is a timing diagram illustrating some waveforms that occur in the preferred embodiment shown in FIG. 1.

FIG. 2 is a timing diagram showing a typical progression occurrence of the receive window signal, the stop signal and the gain signal in one cycle of operation.

The signal RX_WINDOW in FIG. 2 represents a signal which enables the acquisition of samples by the analog-to-digital converters 3 and 4. The signal AGC_STOP goes high for the duration of a time slot during which the receiver is to receive its allotted signal, and inhibits any change in the gain set by the AGC circuit. FIG. 2 illustrates the attainment of a maximum gain, set by the threshold register 7, before the rising edge of the AGC_STOP signal but the gain will be held constant for the duration (i.e. the high state) of the AGC_STOP signal even if the threshold has not been reached. The reason for this is that the receiver normally includes an equaliser (not shown) which receives digital samples from the analog-to-digital converters when the AGC_STOP signal goes high and which has a dynamic range (for example 24 dB) very much less than the entire dynamic range of the received signal (typically 104 dB). It is not only important to boost the input signal to within the range of the equaliser but to avoid during the time slot gain variation which will disturb the precise signal strength measurement that the equaliser performs.

Figure 3:
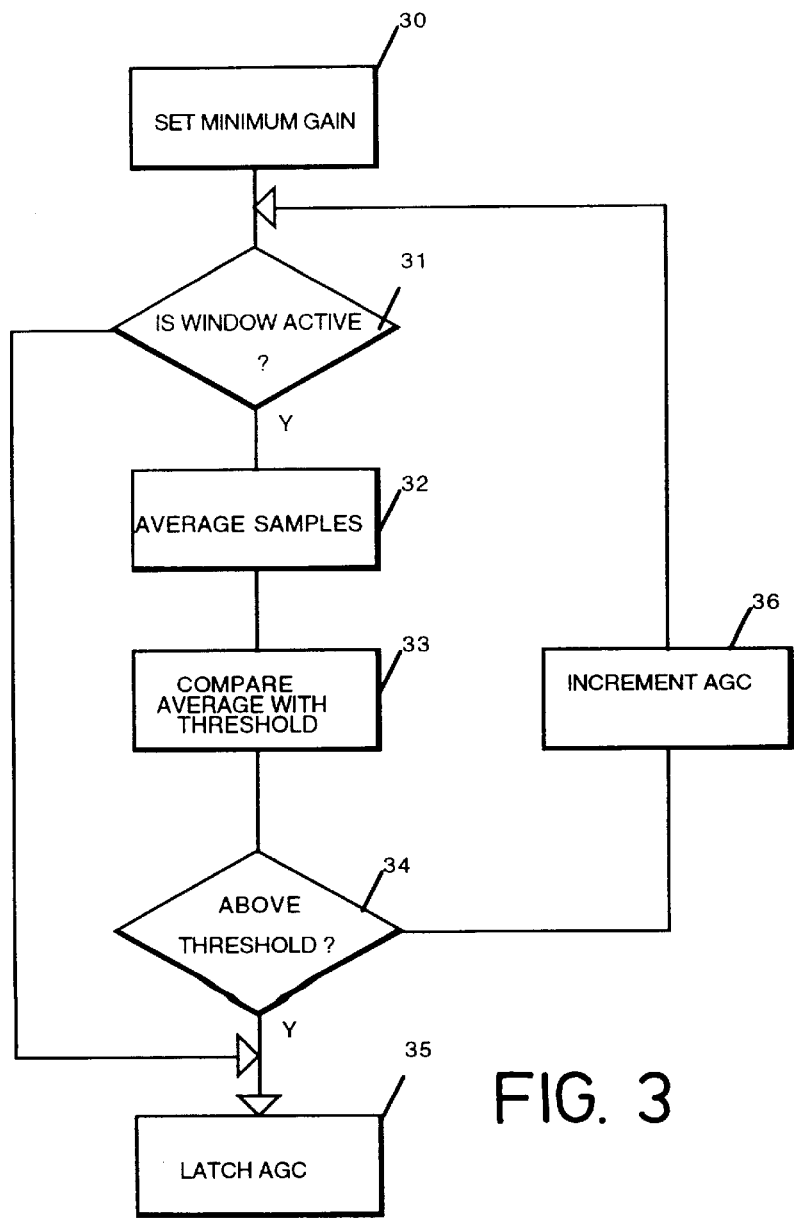
FIG. 3 is a flow diagram illustrating a preferred manner of operation of a gain control system according to the invention.

FIG. 3 is a flow diagram illustrating the operation of the automatic gain control sequencer. As indicated previously, the process starts with the setting of a minimum gain for the receiver, step 30. A test, step 31, is made to determine whether the receive window signal is active. If the window signal is active, the sequencer takes the average of the processed combination of samples, step 32, compares the average with the threshold, step 33 and determines whether the average is above or below the threshold. If the average is above the threshold, or the window is inactive, as determined by step 31, the value of the gain is held at its current value (step 34). If the average is not above the threshold, then the automatic gain control is incremented (step 35) and the operation of the sequencer recycles beginning at step 31, to determine whether the window signal is active and so on.

Figure 4:
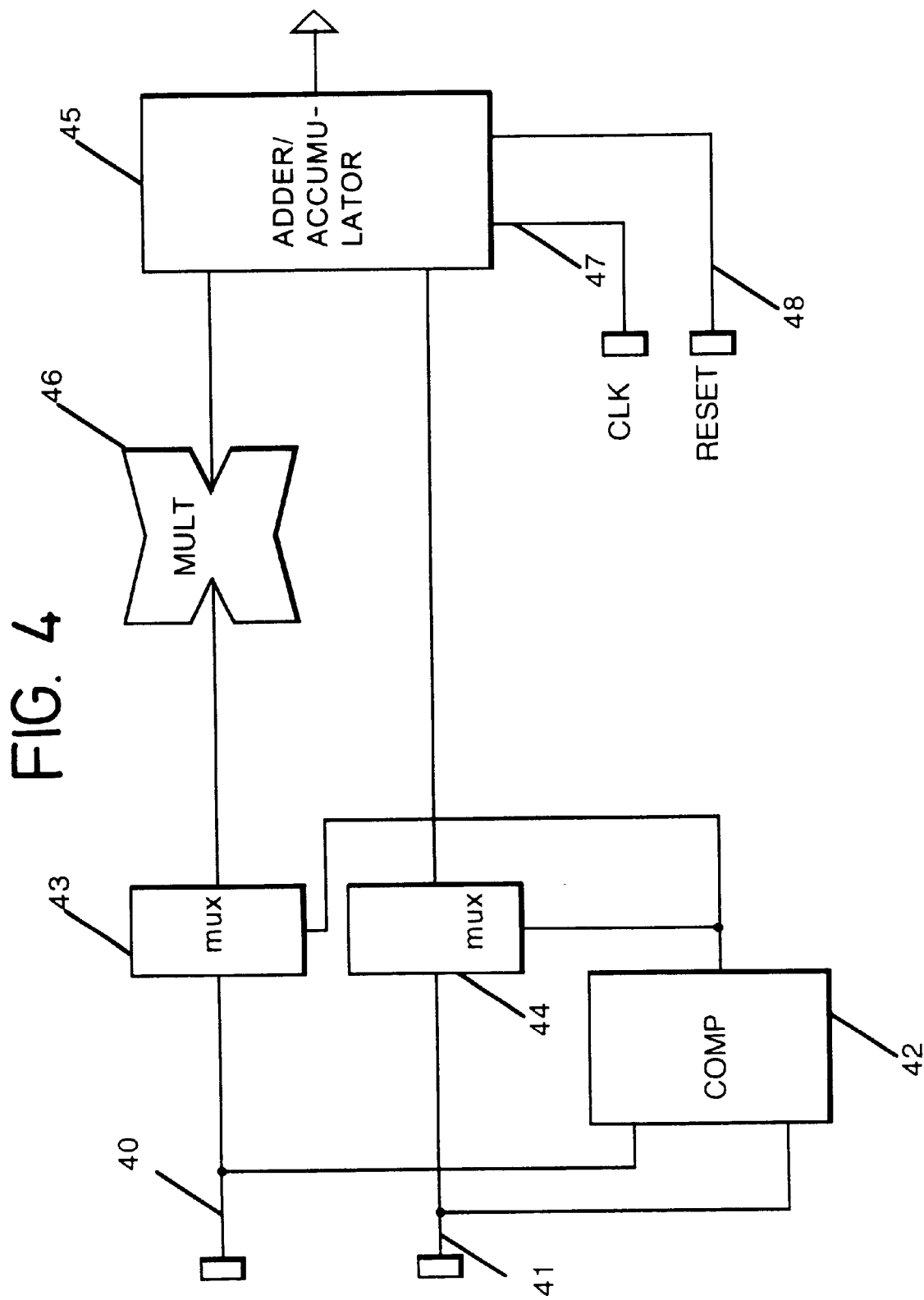
FIG. 4 is a diagram of a calculator of received signal strength.

FIG. 4 illustrates one embodiment of the calculator 5 shown in FIG. 1.

It was mentioned earlier that the calculation of the received signal strength would be different according as the AGC would be applied in baseband or IF band. In any event, the value compared to the threshold register to determine whether or not the gain setting is sufficient is averaged over eight bits. Depending on the frequency band in which AGC is applied, the calculation is as follows:

Base band mode $$RSS = 1/8 \sum_{n=1}^{n=8} \sqrt{(I_n^2 + Q_n^2)}$$

this is approximated as $$RSS = 1/8 \sum_{n=1}^{n=8} [\text{Max}(|I_n|, |Q_n|) + 3/8 \times \text{Min}(|I_n|, |Q_n|)]$$

The system should therefore allow sufficient 8 bit periods between the rising edge to allow the AGC loop to complete its operation. For example, if the system requires a maximum of 10 increments to find the correct gain setting then a period of at least 80 bit periods should be allowed. Preferably the first four samples after the RSS computation commences are discarded in order to flush out the ADCs, so that 84 bit periods should be allowed.

IF mode $$RSS = 1/8 \sum_{n=1}^{n=8} |I_n|$$

In this case, since the I input only is used for the IF signal, and the samples may be taken four times per bit period, the average takes only 2 bit periods.

The calculator shown in FIG. 4 is arranged for computing the RSS for the baseband mode. Since the calculation for the IF band involves merely the accumulation of eight samples and division by eight, it need not be specifically illustrated.

Referring now to FIG. 4, successive pairs of I and Q baseband samples input on lines 40 and 41 are received by a comparator circuit 42 which determines which sample of each pair has the larger absolute magnitude and controls multiplexers 43 and 44 to direct the larger sample to one input of an adder/accumulator 45 and the smaller sample to an input of a ⅜ multiplier 46. The output of the multiplier is coupled to a second input of the adder/accumulator which is controlled by clock and reset inputs 47 and 48 to provide after eight pairs of samples the mean value as defined above for the baseband mode. The multiplier, performs on each of its input samples a multiplication by three and a division by eight. The multiplication is implemented by a 1-bit shift and an addition (since 3n is equal to n+2n) and the division by eight is implemented by a 3-bit shift.

We claim:

1. An automatic gain control system for use with a receiver including means for producing in-phase (I) and quadrature (Q) signals said automatic gain control system comprising:
   means for converting said I and Q signals to first and second samples respectively;
   means for computing a received signal strength value in response to said first and second samples;
   means for comparing said received signal strength value with a threshold;
   means for incrementally changing a gain value provided said received signal strength value is less than said threshold; and
   means for providing said receiver with an automatic gain control signal which is based upon said gain value,
   wherein said computing means computes for each of a succession of samples the quantity:
   Smx-K.Smn, where Smx represents the larger of the first and second samples in a pair and Smn represents the lesser of first and second samples in a pair, and K is a fractional coefficient.

2. A system according to claim 1 wherein K is a coefficient composed of at least one binary fraction.

3. A system according to claim 1 wherein the means for computing a received signal strength value provides an average of a multiplicity of received signal strength values from respective pairs of I and Q samples.

4. An automatic gain control system for use with a receiver including means for producing in-phase (I) and quadrature (Q) signals, said automatic gain control system comprising:
   means for converting said I and Q signals to first and second samples respectively;
   means for computing a received signal strength value in response to said first and second samples;
   means for comparing said received signal strength value with a threshold;
   means for incrementally changing a gain value provided said received signal strength value is less than said threshold; and
   means for providing said receiver with an automatic gain control signal which is based upon said gain value,
   wherein the means for incrementally changing the gain value comprises:
   an adder having first and second inputs and an output;
   means for providing an incremental value to said first input of the adder;
   means coupled to said output of the adder for holding a result value; and
   means for coupling the result value to said second input of the adder.

5. A system according to claim 4 and including a multiplexer for selectively passing an initial gain value and an output of the adder to said means for holding said result value.

6. A system according to claim 4 and further comprising means for selecting the slope of the output of the adder to be positive or negative.

7. An automatic gain control system for use with a receiver including means for producing in-phase (I) and quadrature (Q) signals, said automatic gain control system comprising:
   means for computing a received signal strength value in response to at least said in-phase signal;
   means for comparing said received signal strength value with a threshold;
   means for incrementally changing a gain value when said received signal strength value is less than said threshold;
   means for providing said receiver with an automatic gain control signal which is based upon said gain value; and
   means for inhibiting any change in said gain value after said received signal strength value reaches said threshold,
   wherein the means for computing a received signal strength value provides an average of a multiplicity of received signal strength values, and
   wherein the means for incrementally changing the gain value comprises:
   an adder having first and second inputs and an output;
   means for providing an incremental value to said first input of the adder;
   means coupled to said output of the adder for holding a result value; and
   means for coupling the result value to said second input of the adder.

8. A system according to claim 7 and including a multiplexer for selectively passing an initial gain value and an output of the adder to said means for holding said result value.

9. A system according to claim 7 and further comprising means for selecting the slope of the output of the adder to be positive or negative.

10. An automatic gain control system for use with a demodulator which utilizes a variable gain amplifier in producing in-phase and quadrature signals, comprising:

means for storing a result value;

means for converting the stored result value to provide an automatic gain control signal for the variable gain amplifier;

a receive signal strength indicator generating a receive signal strength value in response to at least the in-phase signal;

a comparator comparing the receive signal strength value to a predetermined threshold value and generating a comparator output value;

an adder receiving the stored result value as an input and adding an increment value to the received result value to produce an adder output value;

means for setting the stored result value equal to the adder output value when the comparator output value indicates that the receive signal strength value is less than the predetermined threshold value and for inhibiting any change in the stored result value when the comparator output value indicates that the receive signal strength value is greater than the predetermined threshold value; and a multiplexer for selectively setting the stored result value to equal either the adder output value or an initial value.

11. An automatic gain control system for use with a demodulator which utilizes a variable gain amplifier in producing in-phase and quadrature signals, comprising:

means for storing a result value;

means for converting the stored result value to provide an automatic gain control signal for the variable gain amplifier;

a receive signal strength indicator generating a receive signal strength value in response to at least the in-phase signal;

a comparator comparing the receive signal strength value to a predetermined threshold value and generating a comparator output value;

an adder receiving the stored result value as an input and adding an increment value to the received result value to produce an adder output value;

means for setting the stored result value equal to the adder output value when the comparator output value indicates that the receive signal strength value is less than the predetermined threshold value and for inhibiting any change in the stored result value when the comparator output value indicates that the receive signal strength value is greater than the predetermined threshold value; and means for setting the increment value to be either positive or negative.

12. An automatic gain control system for use with a demodulator which utilizes a variable gain amplifier in producing in-phase and quadrature signals, comprising:

means for storing a result value;

means for converting the stored result value to provide an automatic gain control signal for the variable gain amplifier;

a receive signal strength indicator generating a receive signal strength value in response to at least the in-phase signal;

a comparator comparing the receive signal strength value to a predetermined threshold value and generating a comparator output value;

an adder receiving the stored result value as an input and adding an increment value to the received result value to produce an adder output value; and means for setting the stored result value equal to the adder output value when the comparator output value indicates that the receive signal strength value is less than the predetermined threshold value and for inhibiting any change in the stored result value when the comparator output value indicates that the receive signal strength value is greater than the predetermined threshold value, wherein said receive signal strength indicator averages an absolute value of the in-phase signal to generate the receive signal strength value.

13. An automatic gain control system for use with a demodulator which utilizes a variable gain amplifier in producing in-phase and quadrature signals, comprising:

means for storing a result value;

means for converting the stored result value to provide an automatic gain control signal for the variable gain amplifier;

a receive signal strength indicator generating a receive signal strength value in response to at least the in-phase signal;

a comparator comparing the receive signal strength value to a predetermined threshold value and generating a comparator output value;

an adder receiving the stored result value as an input and adding an increment value to the received result value to produce an adder output value; and means for setting the stored result value equal to the adder output value when the comparator output value indicates that the receive signal strength value is less than the predetermined threshold value and for inhibiting any change in the stored result value when the comparator output value indicates that the receive signal strength value is greater than the predetermined threshold value, wherein said receive signal strength indicator averages a root-mean-square value of the in-phase and quadrature signals to generate the receive signal strength value.

* * * * *